(12) United States Patent
Gallatin et al.

(10) Patent No.: US 6,259,513 B1
(45) Date of Patent: *Jul. 10, 2001

(54) ILLUMINATION SYSTEM WITH SPATIALLY CONTROLLABLE PARTIAL COHERENCE

(75) Inventors: Gregg Gallatin; Andrew W. McCullough, both of Newtown, CT (US)

(73) Assignee: SVG Lithography Systems, Inc., Wilton, CT (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/799,107

(22) Filed: Feb. 11, 1997

Related U.S. Application Data

(60) Provisional application No. 60/031,725, filed on Nov. 25, 1996.

(51) Int. Cl.[7] .................................................. G03B 27/72
(52) U.S. Cl. ................................................................ 355/71
(58) Field of Search .................................. 355/53, 67, 69, 355/70, 71

(56) References Cited

U.S. PATENT DOCUMENTS

| | | | |
|---|---|---|---|
| 4,621,922 | * 11/1986 | Tabarelli et al. | 355/41 |
| 5,184,176 | * 2/1993 | Unno et al. | 355/52 |
| 5,296,892 | 3/1994 | Mori . | |
| 5,329,336 | * 7/1994 | Hirano et al. | 355/53 |
| 5,357,312 | 10/1994 | Tounai . | |
| 5,383,000 | 1/1995 | Michaloski et al. | 355/67 |
| 5,446,587 | * 8/1995 | Kang et al. | 356/401 |
| 5,631,721 | * 5/1997 | Stanton et al. | 355/71 |
| 5,642,183 | * 6/1997 | Sugihara et al. | 355/71 |
| 5,673,103 | 9/1997 | Inoue et al. | 355/71 |
| 5,684,566 | * 11/1997 | Stanton | 355/67 |
| 6,049,374 | * 4/2000 | Komatsuda et al. | 355/67 |
| 6,078,380 | * 6/2000 | Taniguchi et al. | 355/52 |

FOREIGN PATENT DOCUMENTS

| | | |
|---|---|---|
| 0 486 316 A2 | 5/1992 | (EP) . |
| 0 564 264 A1 | 10/1993 | (EP) . |
| 07094399 | 4/1995 | (JP) . |
| 07201723 | 8/1995 | (JP) . |

* cited by examiner

Primary Examiner—Christopher Mahoney
(74) Attorney, Agent, or Firm—Fattibene & Fattibene; Paul A. Fattibene; Arthur T. Fattibene

(57) ABSTRACT

An illumination system used in photolithography for the manufacture of semiconductors having an array optical element with different illumination regions matched to different geometric pattern regions on a reticle. The array optical element may be a filter, diffractive optical element, or microlens array having illumination regions producing different types of illumination properties or characteristics such as quadrupole, annular, or top hat among others. Each of the illumination regions are matched to or correspond to a respective pattern region on the reticle to provide optimized exposure of a photosensitive resist covered wafer. The optical element of the present invention may be used to tailor a conventional illumination system to the unique characteristics of a particular reticle. Additionally, imperfections in the optics of a photolithographic system can be compensated for by the optical element. This facilitates the manufacture of semiconductor devices having decreasing feature sizes while improving qualify and increasing yield.

10 Claims, 2 Drawing Sheets

ILLUMINATION SYSTEM WITH SPATIALLY CONTROLLABLE PARTIAL COHERENCE

RELATED APPLICATION

This application claims the benefit of U.S. Provisional Application No. 60/031,725, filed Nov. 25, 1996.

FIELD OF THE INVENTION

The present invention relates generally to semiconductor manufacturing, and more particularly to an illumination system that is spatially controllable and matched to a reticle.

BACKGROUND OF THE INVENTION

Photolithography is often used in the manufacture of semiconductors. A reticle having a circuit pattern thereon is projected onto a photosensitive substrate such as a wafer. The wafer is subsequently processed, forming patterns thereon. This process is generally repeated several times, forming multiple layers. As the art develops and the element sizes of the semiconductor devices become smaller, there is a need for improved illumination sources for projecting the image of a reticle onto a photosensitive substrate. Accordingly, there have been many illumination systems disclosed in an effort to enhance the imaging of a reticle onto a photosensitive substrate. One such illumination system is disclosed in U.S. Pat. No. 5,296,892 entitled "Illuminating Apparatus and Projection Exposure Apparatus Provided With Such Illumination Apparatus" issuing to Mori on Mar. 22, 1994, which is herein incorporated by reference. Therein disclosed is an illumination system having an optical integrator or fly's eye lens positioned next to a condenser. The optical integrator or fly's eye lens is designed to be replaceable so that the numerical aperture on the emission side of the illumination system can be varied. Another illumination system is disclosed in U.S. Pat. No. 5,357,312 entitled "Illuminating System In Exposure Apparatus For Photolithography" issuing to Tounai on Oct. 18, 1994, which is herein incorporated by reference. Therein disclosed is an illumination system that desirably shapes a uniformalized light beam reducing loss of illuminating light by blockage of an aperture diaphragm. Additionally, the cross sectional shape of the light beam can be rendered annular. Yet another illumination system is disclosed in U.S. Pat. No. 5,329,336 entitled "Exposure Method and Apparatus" issuing to Hirano et al. on Jul. 12, 1994. Therein disclosed is an exposure apparatus having a detector that is compensated for due to coherence changes in the exposure apparatus. Additionally, the concept of zone and modified light source illumination is disclosed for the purpose of optimizing the image of a reticle pattern. Accordingly, there is a need to provide different illumination characteristics for different reticle geometries or patterns. However, due to the complexity of illumination sources and the difficulty of modifying them for a specific reticle pattern or geometry, often it is difficult to provide an optimized illumination pattern for a specific reticle. As a result, some portions of a reticle may be illuminated adequately while others are not. This may result in different imaging results on different portions of a wafer. Therefore, there is a need for an illumination system that optimizes the exposure of a photosensitive substrate irrespective of the different reticle patterns or geometries contained thereon.

SUMMARY OF THE INVENTION

The present invention relates to the use of an optical element which may be a microlens array that is divided into a plurality of different illumination regions, providing different illumination characteristics or profiles for each region. The optical element with its plurality of different regions is matched to a reticle having a plurality of different pattern regions containing different geometries or patterns spatially thereon. Each of the plurality of different illumination regions on the optical element is matched to each of the plurality of different pattern regions on the reticle so as to provide an overall optimized illumination pattern, providing for improved imaging of the reticle irrespective of the differing patterns or geometries contained thereon.

It is an object of the present invention to optimize the performance of an illumination system irrespective of reticle patterns or geometries.

It is another object of the present invention that certain imperfections in the optics of a photolithographic tool may be compensated for easily.

It is an advantage of the present invention that the illumination system can easily be changed to match a particular reticle.

It is a feature of the present invention that different illumination regions of an optical element are matched to different pattern regions of a reticle.

These and other objects, advantages, and features will become readily apparent in view of the following detailed description.

DETAILED DESCRIPTION OF THE PREFERRED EMBODIMENTS

Figure 1:
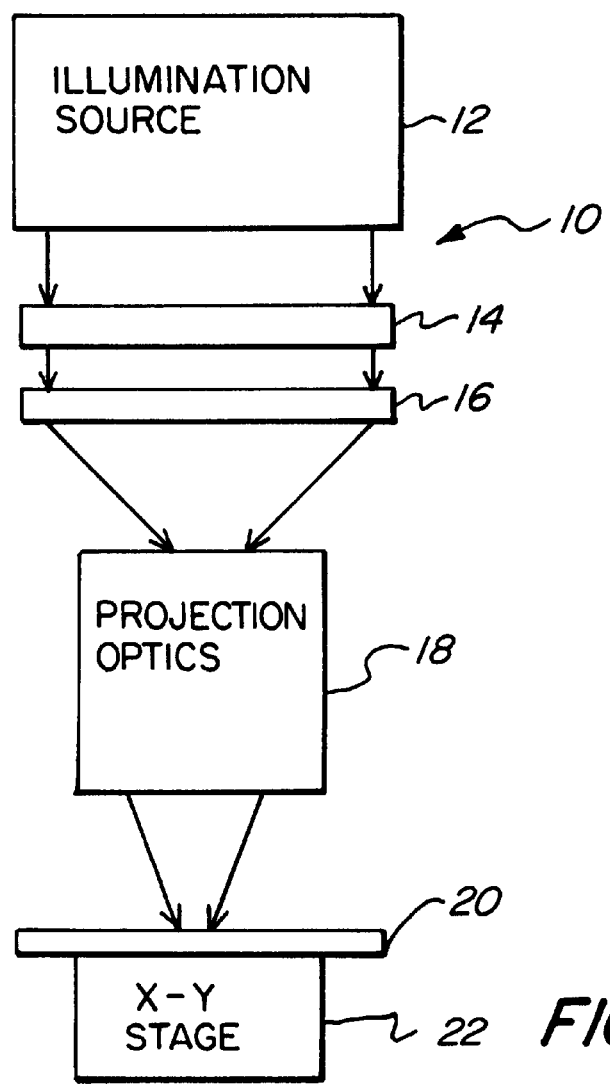
FIG. 1 is a schematic of a photolithographic system.

FIG. 1 schematically illustrates a photolithographic system 10. Illumination source 12 projects electromagnetic radiation through an optical element 14 and onto a reticle 16. An illumination plane is formed at the reticle 16. An image of the reticle 16 is projected onto a wafer 20 by projection optics 18. Wafer 20 has a photosensitive resist coating thereon which is exposed by the image of the reticle 16. Wafer 20 is mounted on a wafer stage 22 which is movable in the X and Y direction. In some photolithography operations, the wafer stage 22 may also be scanned along one axis. The illumination source 12 may be any illumination source or system, such as that disclosed in U.S. patent application Ser. No. 08/449,301 filed May 24, 1995 and entitled "Hybrid Illumination System For Use In Photolithography" by Stanton et al and issued May 20, 1997 as U.S. Pat. No. 5,631,721, which is herein incorporated by reference.

Figure 2:
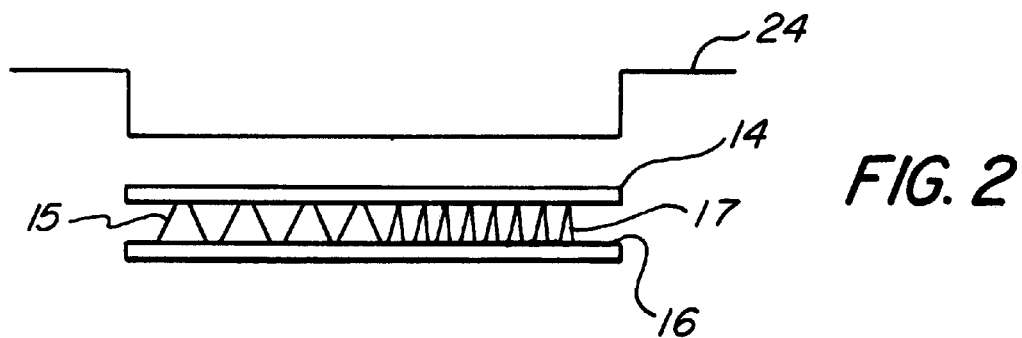
FIG. 2 is a schematic illustrating an embodiment of the present invention.

FIG. 2 illustrates an illumination profile 24 created by the illumination source 12, illustrated in FIG. 1. Generally, it is desirable that the intensity profile 24 is relatively uniform. This relatively uniform illumination intensity profile 24 is projected through the optical element 14. The optical element 14 then creates an illumination field or plane at or adjacent to the reticle 16. The illumination plane formed at reticle 16 projects the image of the reticle 16 onto a photosensitive resist covered wafer 20, illustrated in FIG. 1. Electromagnetic radiation represented by lines 15 illustrate the different illumination properties, such as numerical aperture, fill geometry and others, provided over a region of the reticle by the optical element 14. Electromagnetic radiation represented by lines 17 illustrate other, different illumination properties than those represented by lines 15. While only several different illumination properties are illustrated, clearly there can be many different illumination properties spatially distributed over the reticle 16 by the optical element 14. The number of different illumination regions depends on the reticle 14 and the degree of matching desired.

Figure 3:
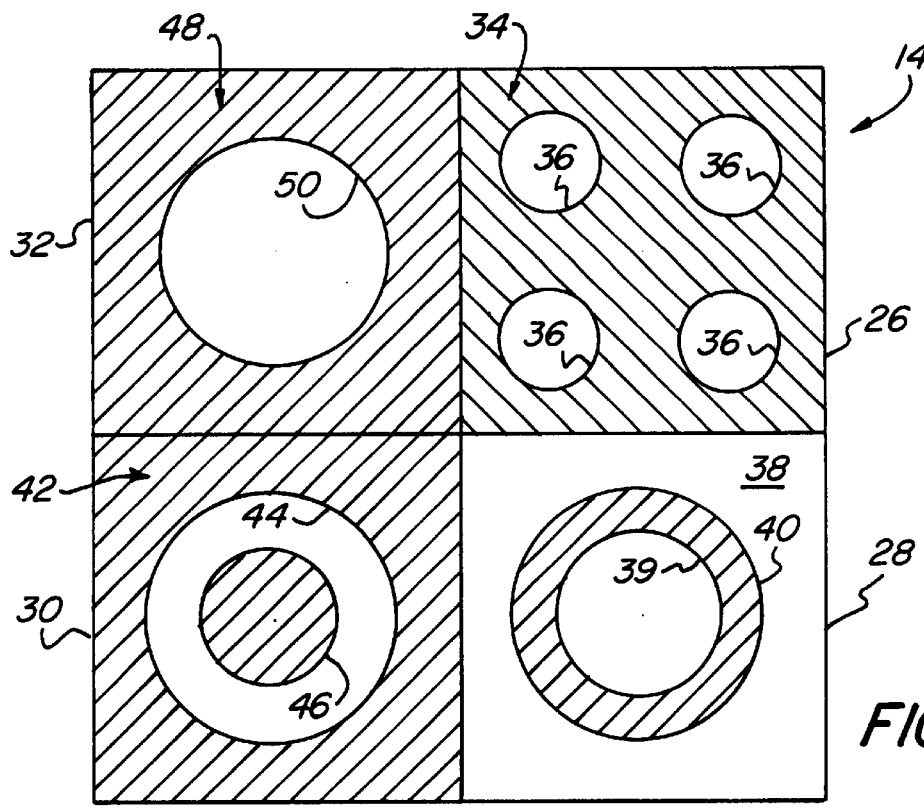
FIG. 3 is a plan view of an optical element.

FIG. 3 generally illustrates an optical element 14 as illustrated in FIGS. 1 and 2. The optical element 14 has several illumination regions 26, 28, 30, and 32 thereon. These illumination regions 26, 28, 30, and 32 may be formed by filters, diffractive optical elements, or preferably by a microlens arrays. Each of the plurality of different illumination regions, 26, 28, 30, and 32 are used to control the illumination properties, such as for example numerical aperture, coherence, fill, and sag, of the resulting illumination used to project the image of the reticle 16 onto a photosensitive resist covered wafer 20, illustrated in FIGS. 1 and 2. Each of these illumination regions 26, 28, 30, 32, may be tailored by known techniques to obtain a desired illumination profile or characteristic for the particular illumination region. For example, illumination region 26 illustrates a quadrupole. A quadrupole illumination is characterized by several circular bright portions 36 located off-axis and surrounded by darker portions 34. Quadrupole illumination may be achieved with pyramidal lenslets formed in a microlens array. Illumination region 28 illustrates an annular illumination region having a bright portion 38 surrounding a dark portion annular ring 40 surrounding a bright circular portion 39. Illumination region 30 has a dark portion 42 surrounded by a bright annular portion 44 with a central dark portion 46. The annular illumination patterns illustrated in illumination regions 30 and 28 may be formed by conical lenslets in a microlens array. Illumination region 32 is formed by a dark portion 48 surrounding a bright circular portion 50 forming a top hat. The illumination pattern illustrated in top hat region 32 may be formed by hexagonal close packed parabolic lenslets in a microlens array. The illumination regions 26, 28, 30, and 32 graphically illustrate several different illumination properties that may be desired. These different illumination properties may include a desired pupil fill or angular distribution of electromagnetic radiation which may be in the form indicated above, namely, top hat illumination, annular illumination, or quadruple illumination. The actual optical elements used to produce the illumination properties graphically illustrated in FIG. 3 may physically appear quite different.

Figure 4:
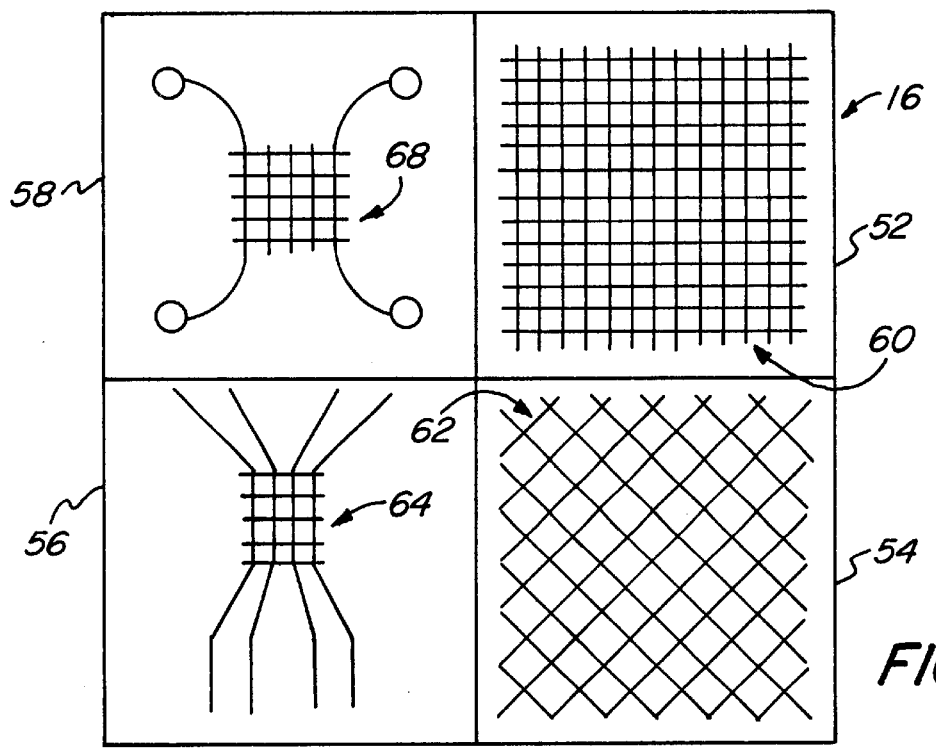
FIG. 4 is a plan view of a reticle.

FIG. 4 is a plan view illustrating a reticle having a plurality of different pattern regions 52, 54, 56, and 58. Each of the different pattern regions 52, 54, 56, and 58 have a different geometrical pattern thereon. For example, pattern region 52 has a right angle grid pattern 60 formed thereon. Pattern region 54 has an angled pattern 62 thereon. Pattern region 56 has a mixed right angle and angled pattern 64 thereon. Pattern region 58 has curved patterns thereon. The differing patterns illustrated at pattern regions 60, 62, 64, and 68 are only by way of example, and illustrate that different patterns or geometric configurations are often present on a single reticle 16 that may be divided into different regions. Many other different patterns or geometric configurations may be used. The geometric configurations graphically illustrate different patterns. The actual patterns illustrated in FIG. 4 may physically appear quite different.

Referring to FIGS. 1–4, the benefits and operation of the present invention can readily be appreciated. Each illumination region 26, 28, 30, and 32 formed by the optical element 14 produces an illumination profile having coherence and fill geometries that are matched to provide an optimized image considering the corresponding pattern regions 52, 54, 56, and 58 on the reticle 16. As illustrated in FIGS. 3 and 4, the illumination regions 26, 28, 30, and 32 spatially correspond to the pattern regions 52, 54, 56, and 58. Accordingly, a more uniform image is obtained irrespective of the different pattern geometries found on a single reticle. This provides improved imaging performance of the photolithographic tool and permits coherence and other illumination properties to be modified as a function of spatial position in the illumination field or plane and optimized based on different patterns at different spatial locations on the reticle. Additionally, illumination properties such as coherence may be varied spatially at different points to compensate for any deviation from desired performance of the illumination field or plane. For example, illumination properties may be varied along one axis to compensate for certain imperfections in projection optics in a scanning type photolithographic tool where a rectangular illumination field is scanned across the reticle. This may be particularly advantageous in that illumination properties may be varied in a longitudinal direction of the rectangular slit being scanned, thereby compensating for any imperfections that may exist in the projection optics. Therefore, optical elements having different illumination regions may not only be used to compensate for differing geometry on the reticle, but the different illumination regions may be used to compensate for imperfections in other optical elements, such as the projection optics, to improve exposure of a photosensitive resist covered wafer or substrate.

Accordingly, the present invention has many practical applications in that different illumination regions can be created on a single optical element used to optimize the exposure of a photosensitive resist covered wafer, greatly augmenting overall system performance.

Although the present invention has been illustrated with respect to several embodiments, it should be readily appreciated that those skilled in the art may make various modifications without departing from the spirit and scope of this invention.

What is claimed is:

1. A photolithographic tool for manufacturing electronic devices comprising:

illumination means for producing electromagnetic radiation;

optical element means, positioned to receive the electromagnetic radiation, for providing a plurality of different fill geometries with different illumination properties at different predetermined spatial locations on a reticle; and projection optic means, positioned to receive the electromagnetic radiation passing through the reticle, for projection an image of the reticle onto the photosensitive substrate, the plurality of different fill geometries compensating for imperfections in said projection optic means, whereby the exposure of the photosensitive substrate is optimized.

2. An illumination system for use in photolithography for exposing a photosensitive substrate comprising:

an illumination source producing electromagnetic radiation having a substantially uniform illumination field;

an optical element positioned to receive the electromagnetic radiation from said illumination source, said optical element having a plurality of spatially separate regions for producing different predetermined angular distributions of the electromagnetic radiation upon passing there through, the predetermined angular distributions selected so as to compensate for any imperfections that exist in projection optics used to project an image of a reticle onto a photosensitive resist covered wafer, wherein the different predetermined angular distributions of electromagnetic radiation are spatially distributed over the reticle.

3. An illumination system for use in photolithography for exposing a photosensitive substrate as in claim 2 wherein:

said optical element comprises a microlens array.

4. An illumination system for use in photolithography for exposing a photosensitive substrate as in claim 2 wherein:

said optical element comprises a diffractive optical element.

5. A photolithographic apparatus comprising:

an illumination source;

a reticle;

projection optics having imperfections, said projection optics positioned between said reticle and a photosensitive resist covered wafer; and optical element means, positioned between said illumination source and said reticle, for providing different cones of illumination spatially distributed over said reticle compensating for the imperfections of said projection optics, whereby reproduction of a pattern on said reticle is improved.

6. A photolithographic apparatus comprising:

an illumination source forming a rectangular illumination field having a longitudinal direction;

projection optics having locations of imperfections;

an array optical element positioned between said illumination system and said projections optics, said array optical element varying illumination properties of the rectangular illumination field in the longitudinal direction compensating for the locations of imperfections of said projection optics; and a stage, whereby the rectangular illumination field is caused to be scanned exposing a photosensitive substrate with the image of a reticle.

7. A photolithographic apparatus as in claim 6 wherein:

the illumination properties comprise angular distribution of electromagnetic radiation.

8. A photolithographic apparatus as in claim 6 wherein:

the illumination properties comprise fill geometry.

9. A photolithographic apparatus as in claim 6 wherein:

the illumination properties comprise partial coherence.

10. A photolithographic apparatus comprising:

an illumination source (12);

a reticle (16);

projection optics (18) having imperfections, said projection optics (18) positioned between said reticle (16) and a photosensitive resist covered wafer (20); and optical element means (14), positioned between said illumination source (12) and said reticle (16), for modifying fill geometry (15, 17) compensating for the imperfections of said projection optics (18), whereby reproduction of a pattern on said reticle is improved.

* * * * *